US007106417B1

(12) United States Patent
Amm (10) Patent No.: US 7,106,417 B1
(45) Date of Patent: Sep. 12, 2006

(54) TILING OF MODULATOR ARRAYS (75) Inventor: David T. Amm, Sunnyvale, CA (US)

(73) Assignee: Silicon Light Machines Corporation, San Jose, CA (US)

(*) Notice: Subject to any disclaimer, the term of this patent is extended or adjusted under 35 U.S.C. 154(b) by 173 days.

(21) Appl. No.: 10/804,501

(22) Filed: Mar. 19, 2004

Related U.S. Application Data (60) Provisional application No. 60/456,706, filed on Mar. 21, 2003.

(51) Int. Cl.
*G03B 27/42* (2006.01)
*G03F 1/00* (2006.01)

(52) U.S. Cl. .......................................... 355/53; 430/5
(58) Field of Classification Search .............. 355/53, 355/67–71; 430/5, 20, 30; 359/291–292
See application file for complete search history.

(56) References Cited

U.S. PATENT DOCUMENTS

| | | | |
|---|---|---|---|
| 6,060,224 A * | 5/2000 | Sweatt et al. ............... 430/395 |
| 6,185,107 B1 | 2/2001 | Wen | |
| 6,215,578 B1 * | 4/2001 | Lin ............................ 359/292 |
| 6,762,867 B1 | 7/2004 | Lippert et al. | |
| 6,831,768 B1 * | 12/2004 | Cebuhar et al. ............. 359/291 |
| 6,870,554 B1 * | 3/2005 | Jain ........................... 345/697 |
| 2005/0046819 A1 * | 3/2005 | Bleeker et al. ............... 355/67 |

\* cited by examiner

*Primary Examiner*—Henry Hung Nguyen
(74) *Attorney, Agent, or Firm*—Okamoto & Benedicto LLP (57) ABSTRACT

In one embodiment, a pixel arrangement may be configured for a maskless lithography application using at least two array tiles, where each array tile includes a two-dimensional array with substantially equally-spaced pixels. A preferred embodiment includes two 500×1000 pixel array tiles separated by a displacement in a first direction and by another displacement in a second direction. In this embodiment, the scanning direction is between the first and second directions so as to form a continuous swath. Additionally, embodiments of this invention can be applied to applications where array tiles of optical modulators are used to modulate electron beams which can subsequently expose electron beam sensitive media.

12 Claims, 9 Drawing Sheets

Figure 1 (conventional)

Figure 2 (conventional)

Figure 3a (conventional)

TILING OF MODULATOR ARRAYS

CROSS-REFERENCE TO RELATED APPLICATIONS

The present application claims the benefit of U.S. Provisional Application No. 60/456,706, entitled "Modulator tiling arrangement for lithography applications," filed Mar. 21, 2003 by inventor David T. Amm. The disclosure of U.S. Provisional Application No. 60/456,706 is hereby incorporated by reference in its entirety.

BACKGROUND OF THE INVENTION

1. Field of the Invention

The present invention relates generally to semiconductor photolithography and, more particularly, to modulator tiling arrangements used in maskless lithography implementations and other applications where optical modulators can be used to create images on optically or thermally sensitive media (including printing applications). Additionally, embodiments of this invention can be applied to applications where arrays of modulators are used to modulate electron beams.

2. Description of the Background Art

A micro electromechanical system (MEMS) typically includes micromechanical structures or light modulating elements that may be actuated using electrical signals. The light-modulating elements may comprise, for example, Grating Light Valve™ (GLV®) light modulating elements available from Silicon Light Machines, Sunnyvale, Calif. (GLV® and Grating Light Valve™ are trademarks of Silicon Light Machines). A light modulator may include an array of moveable structures referred to as "ribbons." Light modulators may be used in various applications, including video, printing, optical switching, and maskless lithography, as just a few general examples.

In a maskless lithography application, a modulator or array of optical (i.e., light) modulators can be moved relative to a surface that an image is to be projected upon. Generally, such an array of optical modulators can create a loose-packed array of exposure zones, or "pixels" on an optically or thermally sensitive material, during a single exposure event. These pixels are typically much smaller than the pitch dimension of the optical modulators. Thus, the array of optical modulators must be scanned in an appropriate manner such that subsequent exposure events can completely fill the media with pixels. This permits high resolution and large pixel density on the optically sensitive media.

Figure 1:
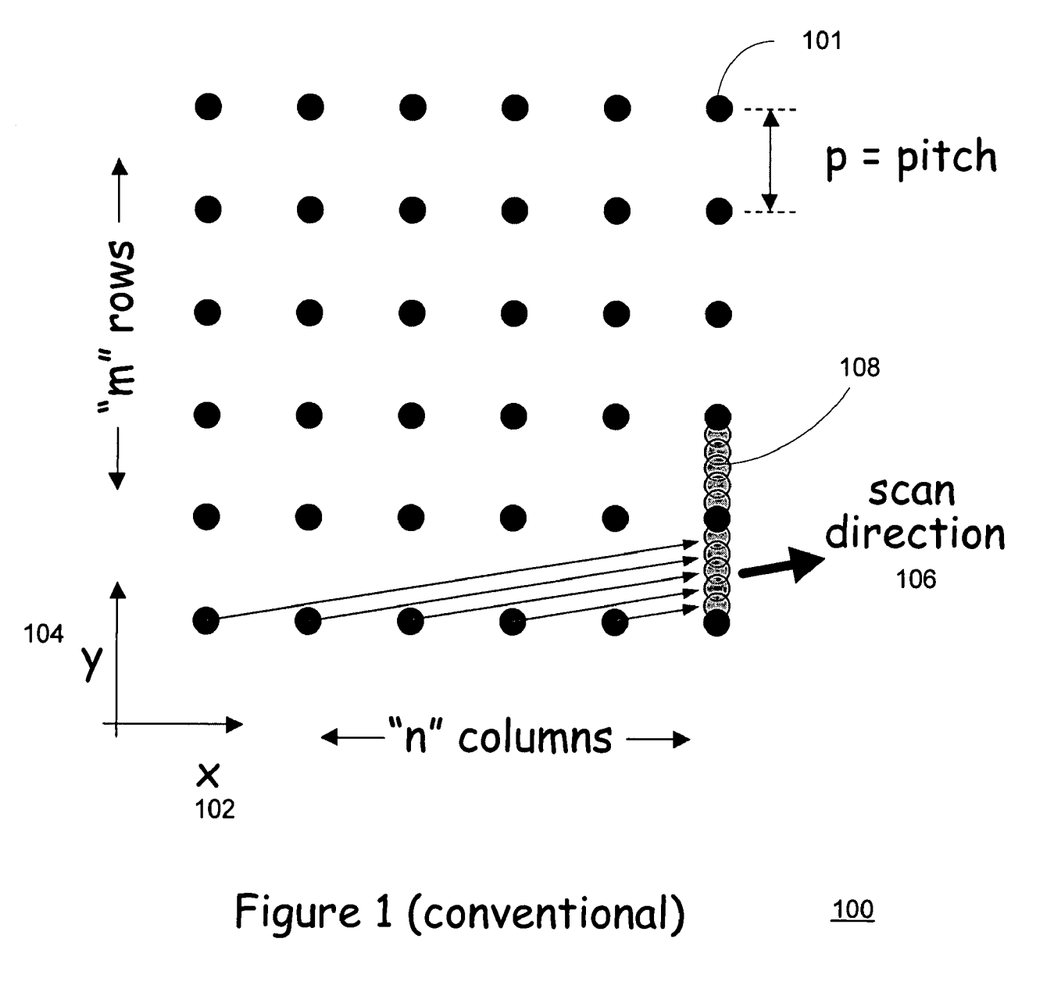
FIG. 1 illustrates a conventional modulator arrangement and scanning in substantially an x-direction.
Figure 2:
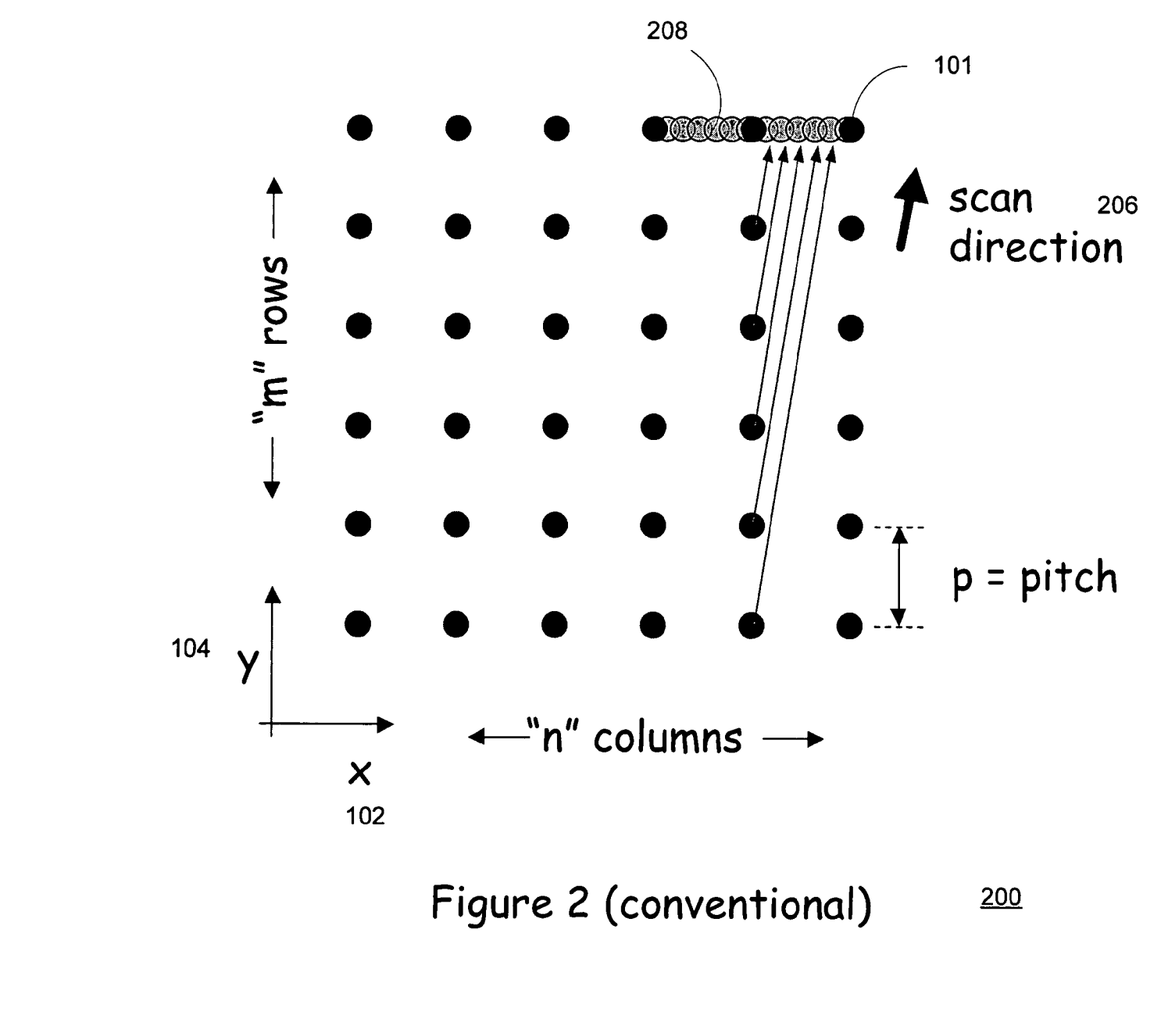
FIG. 2 illustrates a conventional modulator arrangement and scanning in substantially a y-direction.

FIGS. 1 and 2 show two conventional modulator arrangements for maskless lithography. Each modulator arrangement includes an array with "n" columns of modulators in the x-direction, and "m" rows of modulators in the y-direction.

FIG. 1 shows a conventional modulator arrangement 100 with a scanning direction 106 substantially in the x-direction 102, but also with a y-direction 104 component such that the scanning direction 106 is at an angle, as indicated in the figure. In this example, the two-dimensional array includes light modulators 101 with a pitch of "p" and where "n" modulators 101 eventually write "n" pixels 108 within one vertical pitch distance in the scanning process. The written pixel center spacing thus equals (p/n). In this example, the pixel spacing "s" is defined as the distance between the adjacent centers of the printed pixel or exposure location measured substantially perpendicularly to the scanning direction 106 (in this instance, measured in the y-direction 104). For n=500 and p=25 µm (micrometers), then the pixel spacing "s"=p/n=50 nm (nanometers). If m=1000, then the total swath width that can be created is: (n)×(m)×(s)=(500)×(1000)×(50 nm)=25 mm (millimeters).

FIG. 2 shows a conventional modulator arrangement 200 with a scanning direction 206 substantially in the y-direction 104, but also with an x-direction 102 component such that the scanning direction 206 is at an angle, as indicated in the figure. In this example, "m" modulators eventually write "m" pixels 208 within one pitch distance in the scanning process. The written pixel center spacing thus equals (p/m). For m=1000 and p=25 µm, then the pixel spacing "s"=p/m=25 nm. If n=500, then the total swath width that can be created is: (n)×(m)×(s)=(500)×(1000)×(25 nm)=12.5 mm.

SUMMARY

One embodiment of the invention relates to a modulator arrangement configured for maskless lithography or printing applications. The modular arrangement includes at least two array tiles of modulators. Each array tile has a substantially equal modulator pitch. Each array tile is configured to form a plurality of rows, each row extending in a first direction, and a plurality of columns, each column extending in a second direction, wherein the first direction and the second direction are substantially perpendicular to each other. Two adjacent array tiles are separated by a first displacement in the first direction and a second displacement in the second direction.

Another embodiment relates to a writing points array apparatus configured for maskless lithography or printing applications. The apparatus includes at least two sections, each section having a substantially equal writing point pitch. Each section is configured to form a plurality of rows, each row extending in a first direction, and a plurality of columns, each column extending in a second direction. The first direction and the second direction are substantially perpendicular to each other. Two adjacent sections are separated by a first displacement in the first direction and a second displacement in the second direction.

Another embodiment relates to a method of forming a swath of closely-packed pixels on a surface for a maskless lithography or printing application. An arrangement of modulator array tiles is moved relative to the surface along a scan direction between a first direction and a second direction. If the scan direction is closer to the first direction than the second direction, then a first swath of closely-packed pixels is formed with a swath width in the second direction. If the scan direction is closer to the second direction than the first direction, then a second swath of closely-packed pixels is formed with a swath width in the first direction.

DETAILED DESCRIPTION

The above examples in the background section show the effectiveness of a 500×1000 modulator die configuration for maskless lithography applications, as only one example. However, die sizes supporting even larger modulator configurations are difficult to manufacture due to increasing yield loss.

It is therefore desirable to configure a modulator for maskless lithography and other applications using two or more separate modulator arrays. However, multiple die cannot typically be placed side-by-side without a corresponding gap in the array periodicity that can result in associated gaps in the swath coverage. Therefore, what is needed is an arrangement and method whereby a space between multiple modulator arrays can be accommodated to effectively operate in these types of systems.

Described herein are embodiments suitable for maskless lithography and other applications. These embodiments may include light modulators, such as micro-electro-mechanical-systems (MEMS) and devices.

In one embodiment, a modulator arrangement may be configured for a maskless lithography application using at least two arrays of modulators, where each array is a two-dimensional array with substantially equally-spaced modulators. A preferred embodiment includes two 500× 1000 modulator arrays separated by a displacement in a first direction and by another displacement in a second direction. In this embodiment, the scanning direction is between the first and second directions so as to form a continuous swath (in other words, a band, scan, or strip of pixels). Additionally, embodiments of this invention can be applied to applications where arrays of optical modulators are used to modulate electron beams which can subsequently expose electron beam sensitive media.

Figure 3A:
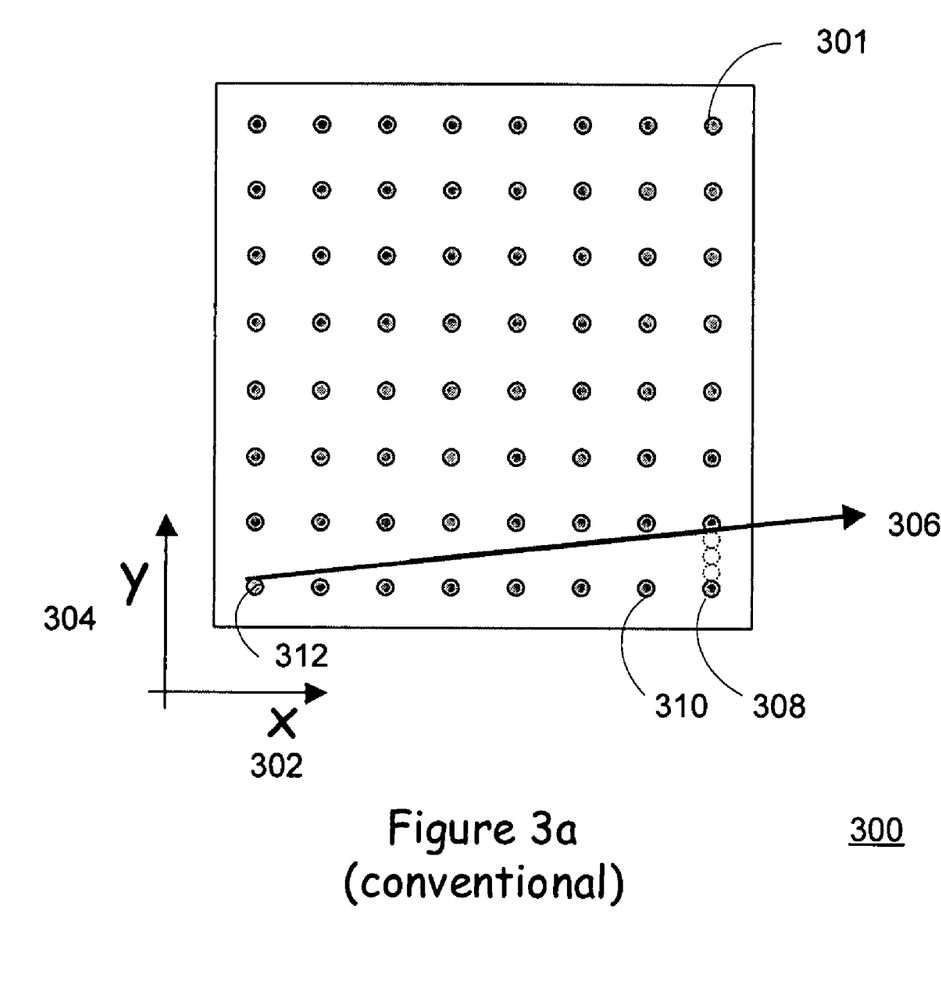
FIG. 3a shows an example of a conventional intact modulator arrangement and a scanning direction.

FIG. 3a shows a conventional modulator array 300 configured for scanning 306 substantially in the x-direction 302, similar to FIG. 1. By scanning the array at the angle depicted in FIG. 3a, a continuous swath of pixels (in other words, a swath of closely-packed pixels) can be formed as shown in FIG. 3a by the dotted circles between the solid circles depicting pixels. Control of the pixel placement includes factoring in the scan direction 306 as well as the scanning rate, and timing of the optical modulators 301, so that light can be modulated and directed to an image surface at the appropriate time to form the continuous swath. For example, for the bottom row of modulators involved in forming the swath as indicated, the rightmost modulator 308 is enabled first, then one modulator over to the left 310 is enabled when it is positioned over the swath area, and so on, until the leftmost modulator 312 is enabled over the designated swath area. In this way, a complete, close-packed, high resolution, two-dimensional image may be formed on an optically sensitive media.

Figure 3B:
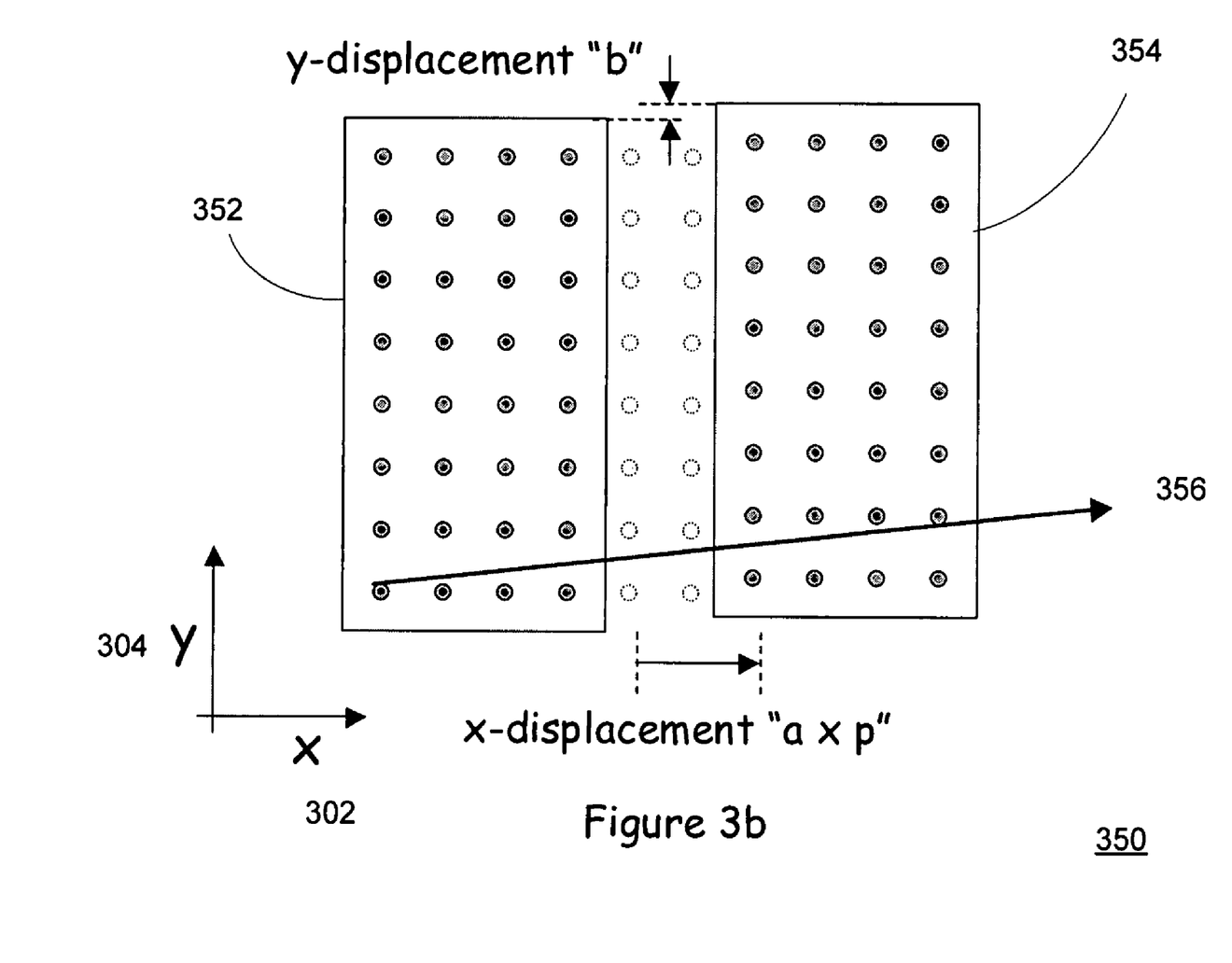
FIG. 3b illustrates split and offset array tiles according to a preferred embodiment.

FIG. 3a can be contrasted with FIG. 3b, which shows a preferred embodiment of the present invention. In FIG. 3b, where an array is split into a first array "tile" 352 and a second array "tile" 354, and where the second array tile 354 is displaced in the x-direction by "a" pitch distances with respect to the first array tile 352, then it may be necessary to offset the second array tile 354 in the y-direction by an amount of "b"=(a×s), where "s" is the pixel spacing as discussed above, in order to maintain the continuous (i.e. closely-packed) swath. Here, "s" is equal to the pitch "p" divided by the total number of columns in the plurality (in this instance, two) array tiles. This configuration 350 is best suited for scanning 356 in substantially the x-direction 302, which is actually some direction between the x-direction 302 and the y-direction 304, but typically closer to the x-direction 302. Using this configuration, a swath can be formed using the same scan direction 356 and a similar scan procedure as described above. Note that in this figure, the dotted circles indicate the future or past pixel positions and do not necessarily indicate modulator on/off control positions. While FIG. 3b shows an example two tile arrangement, the arrangement may be extended to include three or more tiles with neighboring tiles displaced as shown in the figure.

Figure 4:
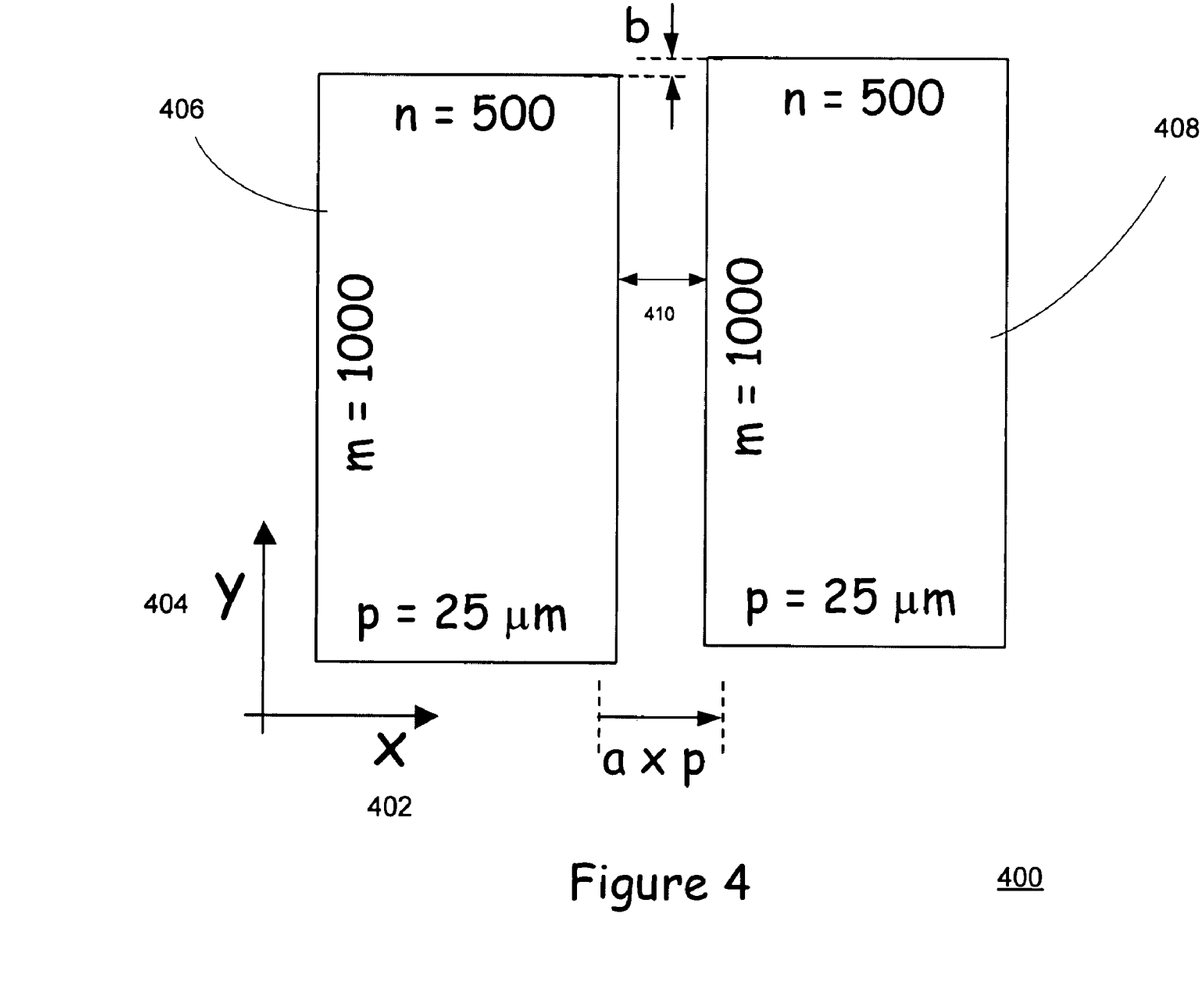
FIG. 4 illustrates an example of two array tiles configured according to the preferred embodiment.

FIG. 4 shows an example two-tile arrangement 400 according to the preferred embodiment. The two-tile arrangement 400 comprises a first tile 406 and a second tile 408. In this example, each array tile is a two-dimensional array organized as 1000 rows of modulators (m=1000) and 500 columns of modulators (n=500). The modulator pitch is represented by "p" and is 25 µm. In this case, each array tile can be a separate semiconductor die so as to maximize the die yield distribution for a given semiconductor process.

A reasonable die spacing (edge to edge) 410 can be about 200 µm. Allowing about 150 µm from each die edge to the modulator column nearest the edge creates a total displacement of about (a×p)=200 µm+2×150 µm=500 µm=0.5 mm. Thus, the array may be displaced in the x-direction 402, for example, by a=20 pitches or cells. In this example, s=25 nm, so the y-displacement of the die would be set to be about (20×25 nm)=0.5 µm. Hence, in order to accommodate such a 0.5 mm gap in the x-direction, the modulator array must be displaced in the y-direction 404 by 0.5 µm, within a precision of approximately 25 nm.

Displacements of this precision can be difficult to achieve. However, in many applications, subsequent focusing arrays (see FIG. 6) between the modulator arrays and the optically sensitive material can substantially reduce the required precision. The use of zone plate arrays or refractive microlens arrays reduce the alignment requirement such that the two MEMS die may need to be aligned only within about ±2 microns, which is readily achievable through optical alignment.

While the displacements, as described above, are important in maintaining the ability to form the swaths in similar fashion to a single 1000×1000 modulator array, the two arrays can be held separate by any suitable means in this embodiment. Examples of structures that could include at least the two separate array tiles include multi-chip modules or printed circuit board (PCB) structures.

Figure 5A:
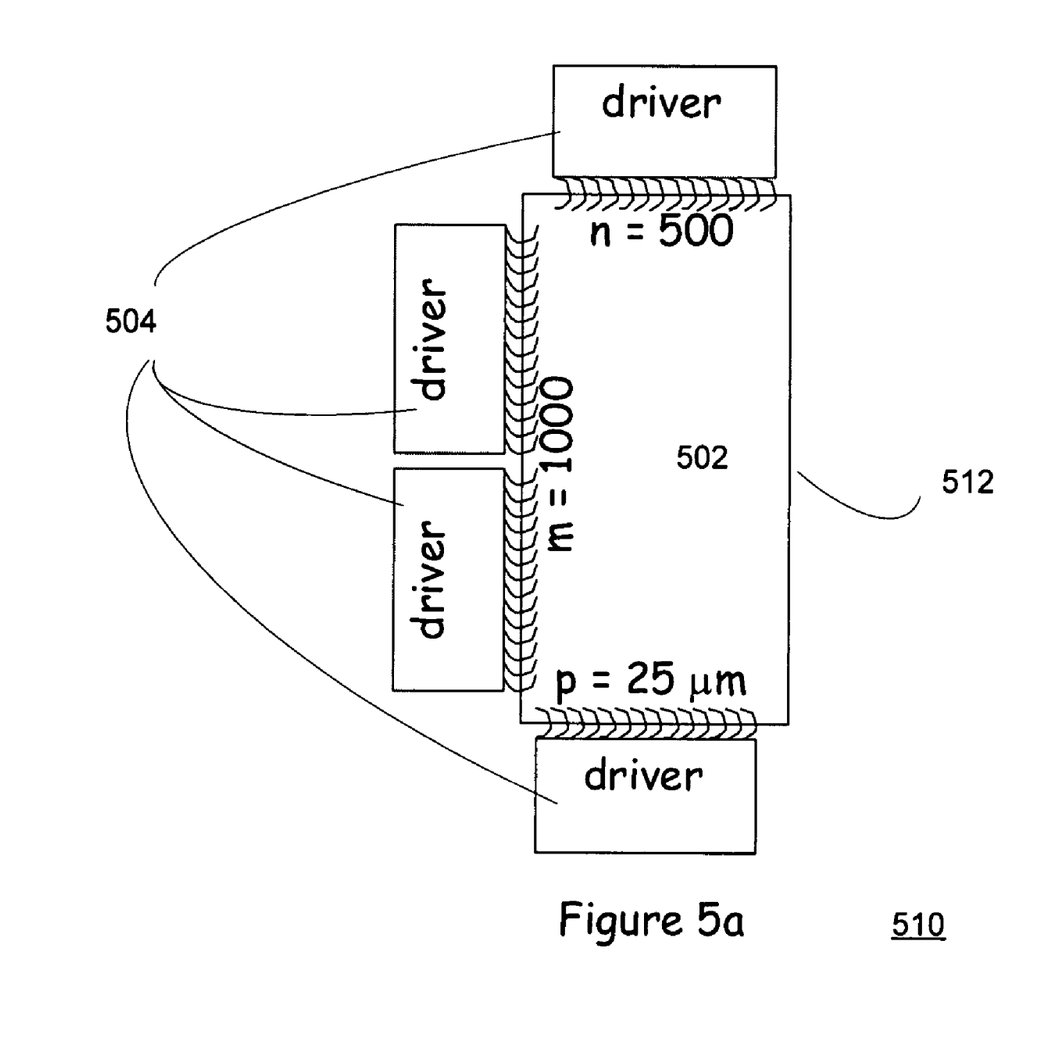
FIG. 5a illustrates an example four-driver configuration according to an embodiment.
Figure 5B:
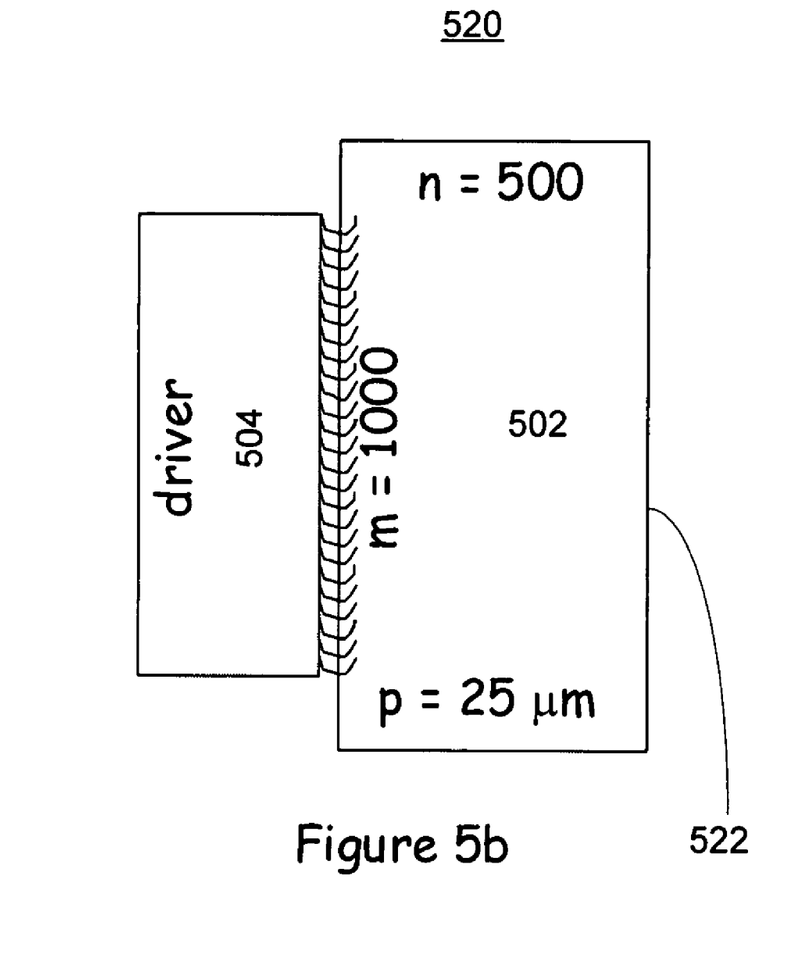
FIG. 5b illustrates an example single-driver configuration according to an embodiment.
Figure 5C:
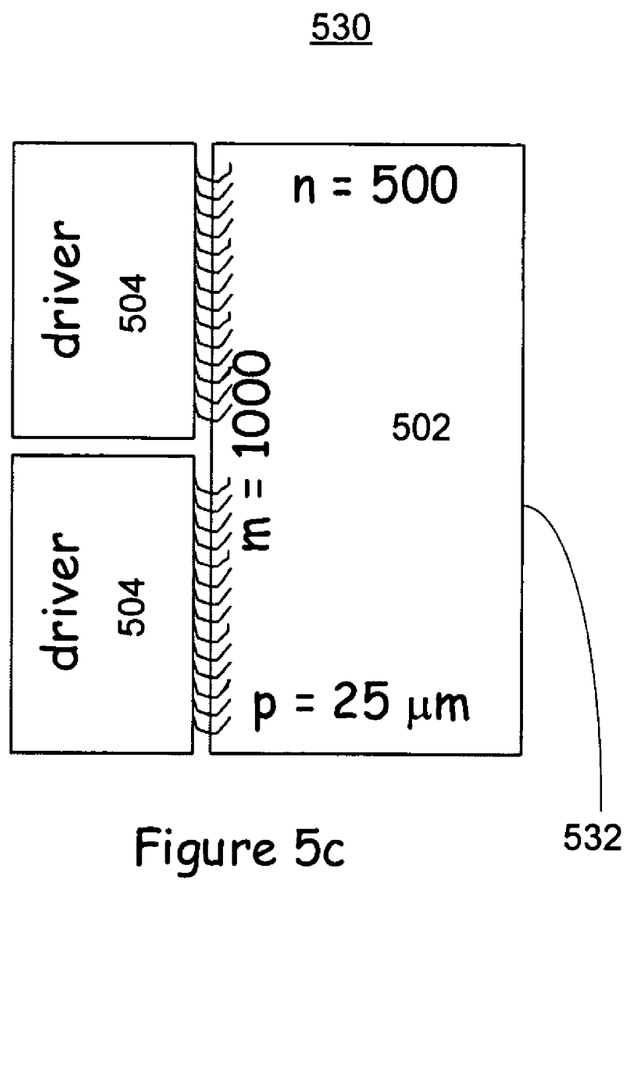
FIG. 5c illustrates an example double-driver configuration according to an embodiment.

FIGS. 5a, 5b, and 5c show various driver circuit location examples as coupled to the exemplified modulator array tile 502. FIG. 5a illustrates a first driver configuration 510 where the driver circuits 504 are positioned on three sides of the modulator array tile 502. The fourth side 512 is left open without any driver circuit 504 since that side 512 will abut a neighboring tile (not shown). FIG. 5b illustrates a second driver configuration 520 where a single driver circuit 504 is positioned on one side of the modulator array tile 502. The opposite side 522 remains open without any driver circuit 504 since that side 522 will abut a neighboring tile (not shown). Similarly, illustrates a third driver configuration 530 where multiple driver circuits 504 are positioned on one side of the modulator array tile 502. The opposite side 532 remains open without any driver circuit 504 since that side 532 will abut a neighboring tile (not shown).

The driver circuits 504 are used to directly control the modulators. For a light modulator including ribbons, these circuits 504 may control a ribbon deflection, for example. For other types of modulators, these drivers 504 may control a light modulating operation for an individual pixel.

These illustrated driver locations, as well as other driver locations, such as having drivers only on the top and bottom of the array, allow for two or more arrays to be configured with the critical displacements, as described above. In each such case, at least one side of the die must be keep clear, and modulators can be moved relatively close (about 200–400 micrometers) within the edge of the die.

Figure 5D:
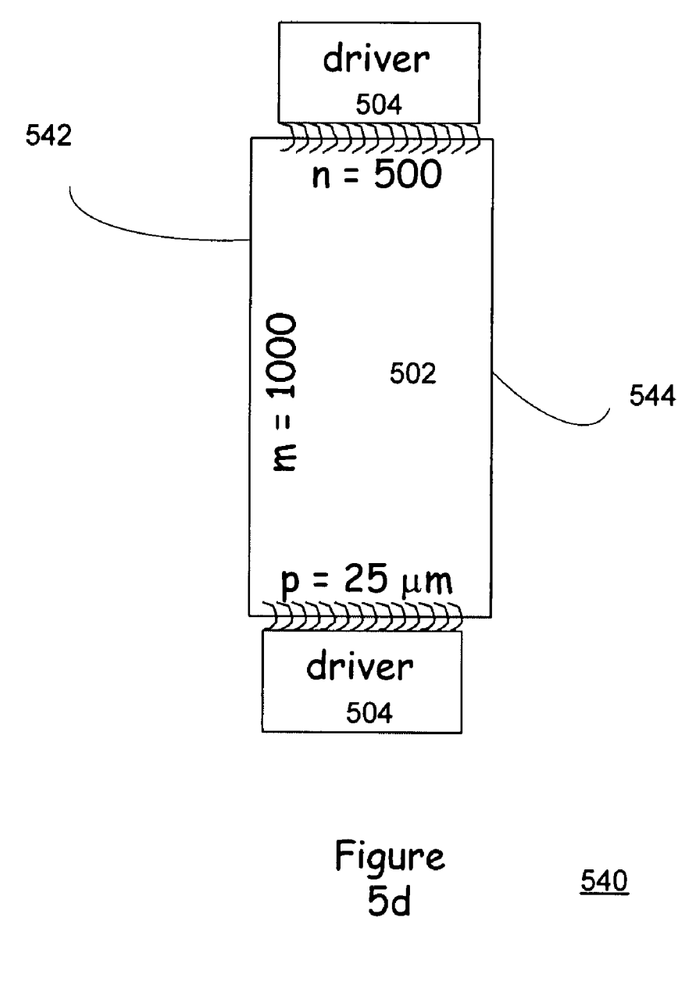
FIG. 5d illustrates an example configuration with drivers on top and bottom sides according to an embodiment.

The "half array" could be designed with 1, 2, 3, 4, or more drivers. As another example, four or more such arrays could be constructed, each having driver circuits 504 on only the top and bottom sides of the array tile 502, as depicted in FIG. 5d. This configuration 540 would keep the left 542 and right 544 sides clear so as to implement according to the critical displacements, as described above.

Ultimately, the alignment precision for the use of multiple light modulating die must be met somewhere in the optical system. In many applications, the final component inserted after the modulator array, but before the media to be written upon, is a focusing array, used to create an array of "writing points." These can be optical lens arrays for some applications, but they can be electron beam arrays for media which can be exposed using electron beams. These final arrays can be fabricated as a single unit where the relative alignment of tiled "sections" or "regions" could be fabricated with high precision.

Figure 6:
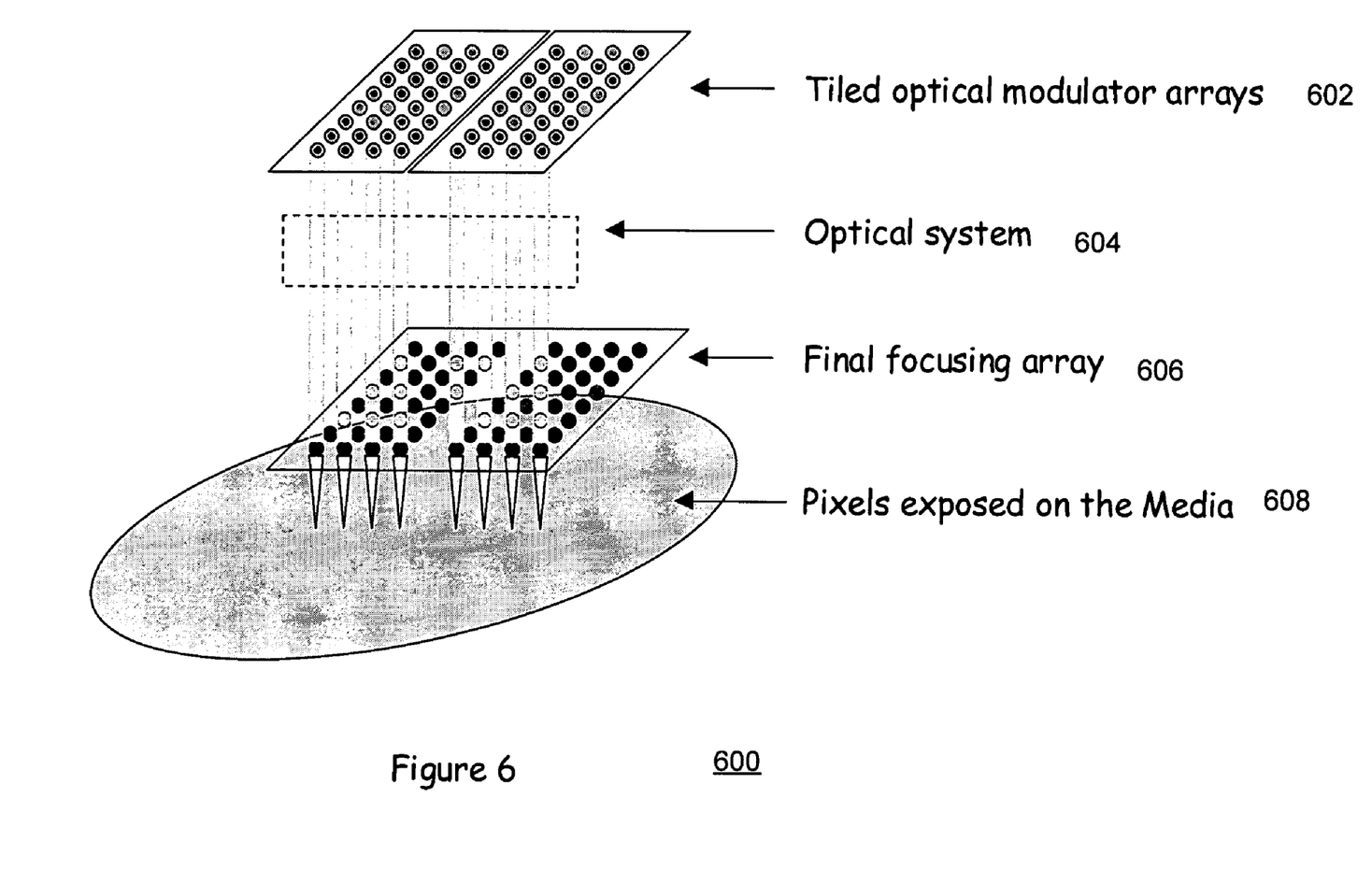
FIG. 6 illustrates a system application example of tiled modulator arrays and a final focusing array according to an embodiment.

FIG. 6 illustrates a system application example of tiled modulator arrays 602, an optical system 604, and a final focusing array 606, according to an embodiment, so as to achieve pixels exposed on the relevant media 608. The focusing array 606 can include two arrays of lenses arranged substantially as described above for the tiled modulator arrays. Alternatively, electron beam arrays can be used in place of the lens arrays 606. In either case, the lens or the electron beam arrays can allow for a reduced alignment requirement such that the two neighboring MEMS die may need to be aligned only within about ±2 microns, which is readily achievable through optical alignment. Further, the lens or electron beam arrays can be configured in two or more regions or sections having substantially the same first and second displacement relationships, as described above for the modulator arrays. Such a system as depicted in FIG. 6 may be extended to include three, four, or more modulator array tiles and a corresponding number of lens or electron beam arrays.

Advantages of the embodiments of this invention include significantly lower risk in MEMS (e.g., light modulator) die fabrication, as well as providing an important intermediate solution with flexibility for production development. Accordingly, effective systems can be constructed with half the data rate, reduced PCB complexity, and a smaller optical field. Also, this approach allows for multiple product resolutions with the same MEMS and driver die, such as a 25 mm swath at a 50 nm step size using a single MEMS die, a 12.5 mm swath at a 25 nm step size using a single MEMS die, and/or a 25 mm swath at a 25 nm step size using two MEMS die. Note also that the two MEMS die can remain on the same illumination "periodic lattice", depending upon the y-axis displacement and the illumination type. Accordingly, the alignment correction between die fields may need to be precise only for the final focusing array. That is, a multi-element optical array, or electron-beam array.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A modulator arrangement configured for maskless lithography or printing applications, the modular arrangement comprising:
   at least two array tiles of modulators, each array tile having a substantially equal modulator pitch and being configured to form a plurality of rows, each row extending in a first direction, and a plurality of columns, each column extending in a second direction,
   wherein the first direction and the second direction are substantially perpendicular to each other,
   wherein two adjacent array tiles are separated by
   a first displacement in the first direction and
   a second displacement in the second direction,
   wherein each of the plurality of rows in each array tile includes a first number of modulators distributed in the first direction, each of the plurality of columns in each array tile includes a second number of modulators distributed in the second direction, the at least two array tiles are configured to move along a scan direction at an angle between the first direction and the second direction, and the scan direction is chosen to form a continuous lithographic swath having a swath width in the second direction, and
   wherein the second displacement is equal to the first displacement divided by a product of a total number of array tiles and the first number of modulators.

2. The modulator arrangement of claim 1, further comprising one or more drivers coupled to each array tile.

3. The modulator arrangement of claim 2,
   wherein the one or more drivers are configured around each array tile on no more than three sides.

4. The modulator arrangement of claim 3,
   wherein each of the array tiles and the one or more drivers are located on a single integrated circuit die.

5. The modulator arrangement of claim 2, wherein the drivers are coupled to top and bottom sides of the array tiles, and wherein the array tiles abut each other on left and right sides.

6. The modulator arrangement of claim 5, wherein the arrangement includes more than two array tiles.

7. The modulator arrangement of claim 1,
   wherein the first and second displacements are chosen such that the modulator arrangement is configured to write pixels onto a media having substantially complete two-dimensional swath coverage.

8. The modulator arrangement of claim 1,
   wherein each modulator comprises a plurality of ribbon structures.

9. The modulator arrangement of claim 8,
   wherein the plurality of ribbon structures includes a number of ribbons selected from a group consisting of from 3 to 15.

10. A writing points array apparatus configured for maskless lithography or printing applications, the apparatus comprising:

at least two sections, each section having a substantially equal writing point pitch and is configured to form a plurality of rows, each row extending in a first direction, and a plurality of columns, each column extending in a second direction, wherein the first direction and the second direction are substantially perpendicular to each other, and wherein two adjacent sections are separated by
a first displacement in the first direction and
a second displacement in the second direction, wherein each of the plurality of rows includes a first number of writing points, each of the plurality of columns includes a second number of writing points, the at least two sections are configured to move along a scan direction between the first direction and the second direction, and the scan direction is chosen to form a continuous lithographic swath having a swath width in the second direction, and wherein the second displacement is equal to the first displacement divided by a product of a total number of sections and the first number of writing points.

11. The writing points array apparatus of claim 10, wherein each of the writing points includes a lens.

12. The writing points array apparatus of claim 10, wherein each of the writing points includes an electron beam generating device.

* * * * *